(12) United States Patent
Lundorf

(10) Patent No.: US 8,794,301 B2
(45) Date of Patent: Aug. 5, 2014

(54) FLOW DISTRIBUTOR ASSEMBLY AND A COOLING UNIT WITH A FLOW DISTRIBUTOR ASSEMBLY

(75) Inventor: René Lundorf, Soenderborg (DK)

(73) Assignee: Danfoss Drivers A/S, Graasten (DK)

( * ) Notice: Subject to any disclaimer, the term of this patent is extended or adjusted under 35 U.S.C. 154(b) by 652 days.

(21) Appl. No.: 12/572,541

(22) Filed: Oct. 2, 2009

(65) Prior Publication Data

US 2010/0181057 A1 Jul. 22, 2010

(30) Foreign Application Priority Data

Oct. 3, 2008 (DK) .................................. 2008 01391

(51) Int. Cl.
*F28F 7/00* (2006.01)

(52) U.S. Cl.
USPC ........... 165/80.4; 165/168; 165/170; 361/699

(58) Field of Classification Search
USPC ............. 165/80.4, 175, 176, 168, 170, 109.1; 361/699; 257/714
See application file for complete search history.

(56) References Cited

U.S. PATENT DOCUMENTS

| 4,093,024 | A * | 6/1978 | Middleton .................... | 165/170 |
|---|---|---|---|---|
| 5,526,231 | A | 6/1996 | Arz et al. | |
| 5,740,018 | A * | 4/1998 | Rumbut, Jr. .................... | 361/720 |
| 6,935,412 | B2 * | 8/2005 | Mueller ........................ | 165/80.4 |
| 7,011,142 | B2 * | 3/2006 | Davies et al. ................. | 165/80.4 |
| 2005/0178528 | A1 * | 8/2005 | Ohashi et al. ................. | 165/80.3 |
| 2007/0012423 | A1 * | 1/2007 | Kinoshita et al. ............. | 165/80.4 |
| 2007/0039717 | A1 * | 2/2007 | Inagaki et al. ............... | 165/80.4 |
| 2007/0227697 | A1 * | 10/2007 | Takahashi .................... | 165/80.4 |
| 2008/0121387 | A1 * | 5/2008 | Taniguchi et al. ............ | 165/175 |

FOREIGN PATENT DOCUMENTS

| EP | 1 795 852 A1 | 6/2007 |
|---|---|---|
| WO | 2005040709 A1 | 5/2005 |
| WO | 2006056199 A1 | 6/2006 |

* cited by examiner

*Primary Examiner* — Cheryl J Tyler
*Assistant Examiner* — David Teitelbaum
(74) *Attorney, Agent, or Firm* — McCormick, Paulding & Huber LLP

(57) ABSTRACT

A flow distributor assembly (13) for distributing a fluid flow across at least two surfaces (15) to be cooled is disclosed. The flow distributor assembly (13) comprises a first flow distributor (1a) and a second flow distributor (1b). Each flow distributor (1a, 1b) has a set of flow cells (3) formed therein, and comprises a connecting region. The first connecting region and the second connecting region are adapted to interconnect in such a manner that the first flow distributor (1a) and the second flow distributor (1b) are joined to form the flow distributor assembly (13), and in such a manner that the first connecting region and the second connecting region in combination define an inlet manifold (9) and an outlet manifold (10), the inlet manifold (9) and the outlet manifold (10) being fluidly connected to each of the flow cells (3) of the first set of flow cells (3) and the second set of flow cells (3). Also disclosed is a cooling unit (17) comprising a housing (14) and a flow distributor assembly (13) arranged in an interior part of the housing (14). The two flow distributors (1a, 1b) allows fluid flow to be distributed across at least two surfaces (15) to be cooled. The flow distributor assembly (13) is easy and cost effective to manufacture because the manifolds (9, 10) are automatically formed when assembling the flow distributor assembly (13).

14 Claims, 5 Drawing Sheets

FLOW DISTRIBUTOR ASSEMBLY AND A COOLING UNIT WITH A FLOW DISTRIBUTOR ASSEMBLY

CROSS REFERENCE TO RELATED APPLICATION

Applicant hereby claims foreign priority benefits under U.S.C. §119 from Danish Patent Application No. PA 2008 01391 filed on Oct. 3, 2008, the contents of which are incorporated by reference herein.

FIELD OF THE INVENTION

The present invention relates to a flow distributor assembly for distributing a fluid flow across at least two surfaces to be cooled. Furthermore, the present invention relates to a cooling unit comprising such a flow distributor assembly.

BACKGROUND OF THE INVENTION

It is known to provide cooling to a surface by guiding a fluid flow across the surface. Sometimes it is desirable to be able to simultaneously guide a fluid flow across two surfaces to be cooled.

U.S. Pat. No. 5,526,231 discloses a cooling unit for a number of power semiconductors. The cooling unit is formed by a quadrangular tube to which the power semiconductors are secured at an exterior with good thermal conductivity, in an equipping region of the tube. The quadrangular tube has a coolant inlet and a coolant outlet. The quadrangular tube contains a laminarization unit disposed in a region following the coolant inlet, this region overlapping the equipping region. In a region between the laminarization unit and the coolant outlet, the quadrangular tube contains a number of turbulence-producing elements for introducing turbulence into the coolant flow. The laminarization unit may be in the form of an insert introduced into the quadrangular tube.

EP 1 795 852 discloses a cooling device for semiconductor elements. The cooling device comprises a housing having a distributor inserted in an interior part thereof. The distributor has a first side having a plurality of flow cells formed therein and a second, oppositely arranged, side having an inlet manifold and an outlet manifold formed therein. Cooling fluid supplied to the inlet manifold is distributed to the flow cells, guided across a surface to be cooled by means of the flow cells, and collected in the outlet manifold. From the outlet manifold the fluid leaves the cooling device.

The cooling units disclosed in U.S. Pat. No. 5,526,231 and EP 1 795 852 are adapted to guide a flow of fluid across only one surface to be cooled.

SUMMARY OF THE INVENTION

It is an object of the invention to provide a flow distributor assembly and a cooling unit being adapted to simultaneously guide a fluid flow across at least two surfaces to be cooled.

It is a further object of the invention to provide a flow distributor assembly adapted to simultaneously guide a fluid flow across at least two surfaces to be cooled, the flow distributor assembly being simple to manufacture.

It is an even further object of the invention to provide a flow distributor assembly adapted to simultaneously guide a fluid flow across at least two surfaces to be cooled, which can be manufactured in a cost effective manner.

According to a first aspect of the invention the above and other objects are fulfilled by providing a flow distributor assembly for distributing a fluid flow across at least two surfaces to be cooled, the flow distributor assembly comprising:
  a first flow distributor having a first set of flow cells formed therein, the first flow distributor comprising a first connecting region, and
  a second flow distributor having a second set of flow cells formed therein, the second flow distributor comprising a second connecting region,
wherein the first connecting region and the second connecting region are adapted to interconnect in such a manner that the first flow distributor and the second flow distributor are joined to form the flow distributor assembly, and in such a manner that the first connecting region and the second connecting region in combination define an inlet manifold and an outlet manifold, the inlet manifold and the outlet manifold being fluidly connected to each of the flow cells of the first set of flow cells and the second set of flow cells.

In the present context the term 'flow distributor assembly' should be interpreted to mean an arrangement in which two or more parts are connected to form a unit which is capable of distributing a fluid flow. The flow distributor assembly according to the present invention is adapted to simultaneously distribute a fluid flow across at least two surfaces to be cooled. The surfaces to be cooled may advantageously be cold plates or other surfaces requiring cooling.

The fluid flow may be a flow of liquid, a flow of gas or a flow of a mixture of liquid and gas, depending on the specific application.

The flow distributor assembly comprises a first flow distributor and a second flow distributor. The first flow distributor has a first set of flow cells formed therein. It should be noted that in the present context the term 'set of flow cells' should be interpreted to mean one or more flow cells formed in the flow distributor. Thus, the first set of flow cells may be a single flow cell arranged to guide a fluid flow across one or more surfaces to be cooled, or it may be two or more flow cells arranged in a certain pattern and in such a manner that they guide a fluid flow across one or more surfaces to be cooled.

Similarly, the second flow distributor has a second set of flow cells formed therein. As described above, this should be interpreted to mean that one or more flow cells are formed in the second flow distributor, and the remarks set forth above with respect to the first set of flow cells are equally applicable here.

The flow cells of the first set of flow cells and the second set of flow cells are preferably arranged in such a manner that the flow cell(s) of the first set of flow cells and the flow cell(s) of the second set of flow cells are adapted to guide a fluid flow across separate surfaces to be cooled. In the case that the flow distributor assembly is adapted to distribute a fluid flow across exactly two surfaces to be cooled, the first set of flow cells is preferably arranged to distribute a fluid flow across one surface, while the second set of flow cells is arranged to distribute a fluid flow across the other surface.

The first flow distributor comprises a first connecting region and the second flow distributor comprises a second connecting region. The first connecting region and the second connecting region are adapted to interconnect in such a manner that the first flow distributor and the second flow distributor are joined to form the flow distributor assembly. Thus, the flow distributor assembly is formed by interconnecting the connecting regions of the two flow distributors. The connecting regions may be interconnected in a permanent manner or in a detachable manner. Furthermore, when the connecting regions are interconnected an inlet manifold and an outlet manifold are formed. The inlet manifold and the outlet manifold are both fluidly connected to each of the flow cells of the first set of flow cells and the second set of flow cells. Thus, fluid entering the inlet manifold is guided into each of the flow cells, through each of the flow cells, out of the flow cells and finally into the outlet manifold, where it is once again collected.

It is an advantage that the inlet manifold and the outlet manifold are defined by the connecting regions, because the manifolds are thereby formed automatically as the connecting regions of the flow distributors are interconnected, and it is not necessary to take additional steps to form the manifolds. This makes it easy and cost effective to manufacture the flow distributor assembly.

Since the flow distributor assembly of the present invention comprises two interconnected flow distributors, each being adapted to distribute a flow of fluid across a surface to be cooled, the flow distributor assembly is adapted to simultaneously guide a fluid flow across at least two surfaces to be cooled.

The first flow distributor and/or the second flow distributor may comprise a fluid inlet and/or a fluid outlet. The fluid inlet is preferably arranged to fluidly interconnect the inlet manifold with a fluid source, and the fluid outlet is preferably arranged to fluidly interconnect the outlet manifold with a fluid drain. Thus, fluid is supplied to the flow distributor assembly via the fluid inlet and fluid is leaving the flow distributor assembly via the fluid outlet.

A fluid inlet as well as a fluid outlet may be formed in one of the flow distributors, while the other flow distributor is neither provided with a fluid inlet, nor a fluid outlet. Alternatively, a fluid inlet may be formed in one flow distributor while a fluid outlet is formed in the other flow distributor. As another alternative, a fluid inlet as well as a fluid outlet may be formed in the first flow distributor as well as in the second flow distributor.

The first flow distributor and the second flow distributor may be identical. According to this embodiment the flow distributor assembly is very easy and cost effective to manufacture, because only one manufacturing tool is required for manufacturing the first flow distributor and the second flow distributor. However, the flow distributors may, alternatively, differ from each other, as long as the connecting regions are adapted to interconnect as described above.

The first connecting region and the second connecting region may be adapted to slidingly engage to interconnect the connecting regions. According to this embodiment, the connecting regions may advantageously be provided with mating tracks or grooves and wall parts or protrusions, respectively, arranged in such a manner that tracks or grooves formed on one connecting region are adapted to receive wall parts or protrusions formed on the other connecting region. Both connecting regions may be provided with tracks/grooves as well as wall parts/protrusions arranged to slidingly engage with a corresponding part at the other connecting region.

Alternatively, the connecting regions may be connected in other ways, e.g. by clicking the connecting regions together.

At least two flow cells of the first set of flow cells and/or at least two flow cells of the second set of flow cells may define parallel flow paths between the inlet manifold and the outlet manifold. This should be interpreted to mean that each of the parallelly arranged flow cells is directly connected to the inlet manifold via a cell inlet, and directly connected to the outlet manifold via a cell outlet. Thus, the fluid entering each of the parallel flow cells has substantially the same temperature. Thereby the temperature gradient across a surface being cooled by these flow cells is significantly decreased.

Alternatively or additionally, all or some of the flow cells may be arranged in series.

At least one of the flow cells may define a meandering flow path between the inlet manifold and the outlet manifold. According to this embodiment the flow direction of the fluid flowing through the flow cell is changed, possibly several times. This causes the fluid to mix, thereby obtaining a more uniform temperature of the fluid. Accordingly, the temperature of the fluid which is closest to the surface to be cooled is decreased, and the cooling capacity of the fluid can be utilised to a greater extent.

The flow distributor assembly may be adapted to be connected to at least one other substantially identical flow distributor assembly. Such a connection may, e.g., be provided via fluid inlets and fluid outlets of the flow distributors of the two flow distributor assemblies. In this case the flow distributor assemblies will normally be connected in series in the sense that the manifolds of the flow distributor assemblies are connected in series. Thereby an extended inlet manifold and an extended outlet manifold may be formed. It should be noted that the flow cells of the flow distributor assemblies may still be connected in parallel or in series between the manifolds as described above.

The flow distributor assembly may further comprise means for forcing the first flow distributor and the second flow distributor in a direction away from each other. In a preferred embodiment the flow distributors are in the form of plates having flow cells formed on one side and part of the inlet manifold and the outlet manifold, as well as the connecting region formed on an opposite side. When the connecting regions of the two flow distributors are interconnected, the sides having the manifold parts formed therein face each other, and the manifolds are thereby formed. Accordingly, the flow cells are directed in opposite directions. The surfaces to be cooled are arranged in such a manner that they are in contact with the flow cells, i.e. two substantially opposing surfaces may be cooled by the first set of flow cells and the second set of flow cells, respectively. Thus, when the first flow distributor and the second flow distributor are forced in a direction away from each other, the flow cells are pushed against the surfaces to be cooled. Thereby the flow distributors may compensate for unevenness in the surfaces to be cooled, e.g. due to the surfaces being curved or due to structures in the surfaces. Accordingly, a close contact between the flow cells and the surfaces to be cooled is ensured.

The means for forcing the first flow distributor and the second flow distributor in a direction away from each other may comprise a set of resilient fingers arranged on one or both of the flow distributors on the side where the connecting regions and the manifold parts are formed.

According to a second aspect of the invention the above and other objects are fulfilled by providing a cooling unit comprising a housing defining an inner cavity and a flow distributor assembly according to the first aspect of the invention inserted into the inner cavity of the housing.

It should be noted that a person skilled in the art would readily recognise that any feature described in combination with the first aspect of the invention could also be combined with the second aspect of the invention, and vice versa.

The surfaces to be cooled are preferably walls of the housing.

The first flow distributor and the second flow distributor may each comprise an end cap adapted to abut an opening of the housing through which the flow distributor is inserted into the inner cavity of the housing. According to this embodiment, the housing is automatically closed when the flow distributors are inserted into the inner cavity of the housing. Alternatively, the cooling unit may be provided with separate end caps.

The end caps of the flow distributors may be provided with sealing means for providing sealing between the end caps and the housing. According to this embodiment the housing is automatically closed in a substantially fluid tight manner when the flow distributors are inserted into the inner cavity of the housing.

Each of the end caps may be provided with a fluid inlet establishing a fluid connected between a fluid source and the inlet manifold, and a fluid outlet, establishing a fluid connection between the outlet manifold and a fluid drain. The flow distributors may be manufactured with a blinded fluid inlet and a blinded fluid outlet. In the case that it is desired that a specific flow distributor should be provided with a fluid inlet and/or a fluid outlet, the relevant inlet and/or outlet is/are simply opened, e.g. by boring out the relevant inlet/outlet.

The first flow distributor and the second flow distributor may be inserted in the inner cavity of the housing through openings in the housing arranged substantially opposite to each other. According to this embodiment, the housing preferably forms a tube-like structure, and the flow distributors are inserted from opposing end parts of the tube, preferably in a sliding movement. The connecting regions of the flow distributors are preferably adapted to slidingly engage as described above.

The housing may define at least two surfaces to be cooled, and the flow cells of the first set of flow cells may be arranged to distribute a flow of fluid across at least a first surface to be cooled and the flow cells of the second set of flow cells may be arranged to distribute a flow of fluid across at least a second surface to be cooled. The first surface to be cooled and the second surface to be cooled may be arranged substantially opposite to each other.

The housing may be an extruded cold plate.

BRIEF DESCRIPTION OF THE DRAWINGS

The invention will now be described in further details with reference to the accompanying drawings in which.

DETAILED DESCRIPTION OF THE PREFERRED EMBODIMENTS

Figure 1:
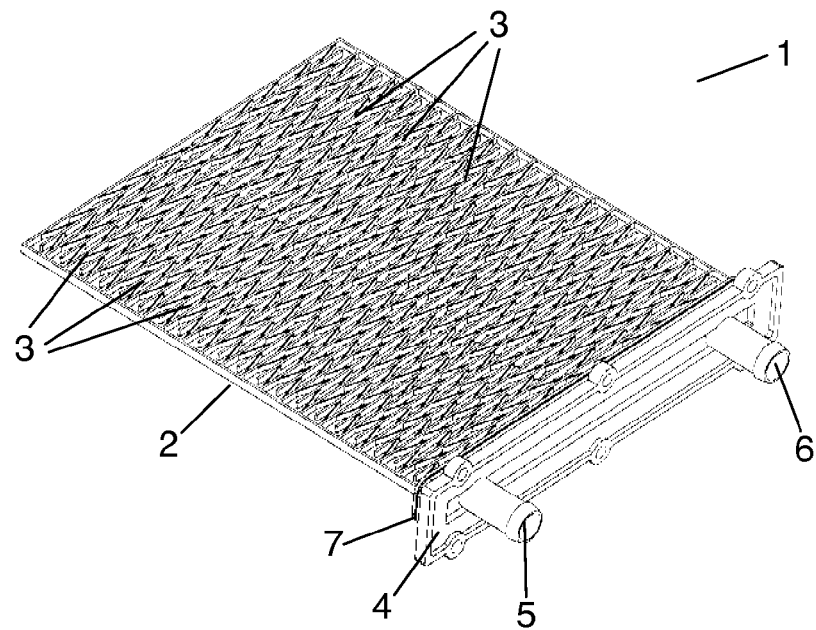
FIG. 1 is a perspective view of a flow distributor for a flow distributor assembly according to an embodiment of the invention.

FIG. 1 is a perspective view of a flow distributor 1 according to an embodiment of the invention. The flow distributor 1 comprises a substantially planar plate part 2, having a plurality of flow cells 3 formed in a first side thereof. An end cap 4 is arranged at an end part of the substantially planar plate part 2. A fluid inlet 5 and a fluid outlet 6 are provided on the end cap 4. The end cap 4 is also provided with an O-ring 7 which is adapted to provide sealing against a housing having the flow distributor inserted therein. This will be described in further detail below.

Figure 2:
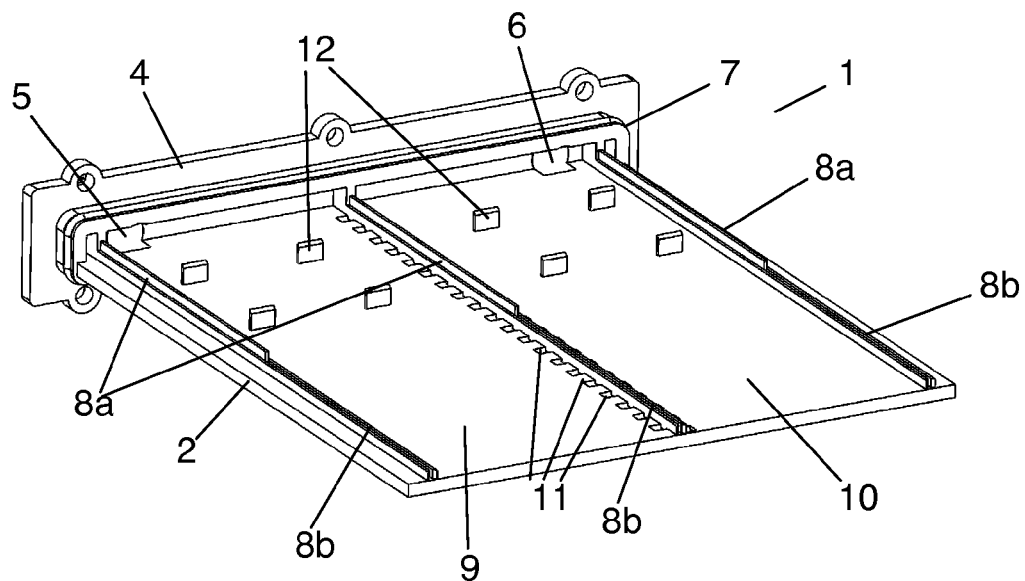
FIG. 2 is a perspective view of the flow distributor of FIG. 1 from a reverse angle.

FIG. 2 is a perspective view of the flow distributor 1 of FIG. 1. In FIG. 2 the flow distributor 1 is shown from a reverse angle, revealing the opposite side of the substantially planar plate part 2. This side of the substantially planar part 2 is provided with three longitudinal walls 8. Each of the longitudinal walls 8 comprises a single wall section 8a and a double wall section 8b. In the single wall section 8a the longitudinal wall 8 is a formed by a single massive wall. In the double wall section 8b the longitudinal wall 8 is split into two parts defining a groove there between. The groove has a size and shape which allows it to receive a single wall section 8a of another identical flow distributor 1.

Thus, two identical flow distributors 1 can be joined to form a flow distributor assembly by sliding the longitudinal walls 8 into each other in such a manner that the single wall section 8a of one flow distributor 1 is received in the groove of the double wall section 8b of the other flow distributor 1, and vice versa. Thereby two separate cavities are formed, separated by the middle longitudinal wall 8. These two cavities form an inlet manifold 9 and an outlet manifold 10, respectively. Accordingly, the longitudinal walls 8 form a connecting region, and when connecting regions of two identical flow distributors 1 are interconnected, an inlet manifold 9 and an outlet manifold 10 are automatically formed.

The inlet manifold 9 is fluidly connected to the fluid inlet 5, and the outlet manifold 10 is fluidly connected to the fluid outlet 6.

The inlet manifold 9 is further fluidly connected to each of the flow cells 3 via a cell inlet 11, and the outlet manifold 10 is fluidly connected to each of the flow cells 3 via a cell outlet (not visible). Fluid entering the inlet manifold 9 via the fluid inlet 5 is supplied to each of the flow cells 3 via the cell inlets 11, is guided along the flow cells 3 and further on to the outlet manifold 10 via the cell outlets. From the outlet manifold 10 the fluid leaves the system via the fluid outlet 6. This will be described further below.

The substantially planar plate part 2 is further provided with eight fingers 12. When the flow distributor 1 is joined to another flow distributor 1 as described above, the fingers 12 will force the flow distributors 1 in a direction away from each other, thereby pushing the flow cells 3 towards respective surfaces to be cooled.

Figure 3:
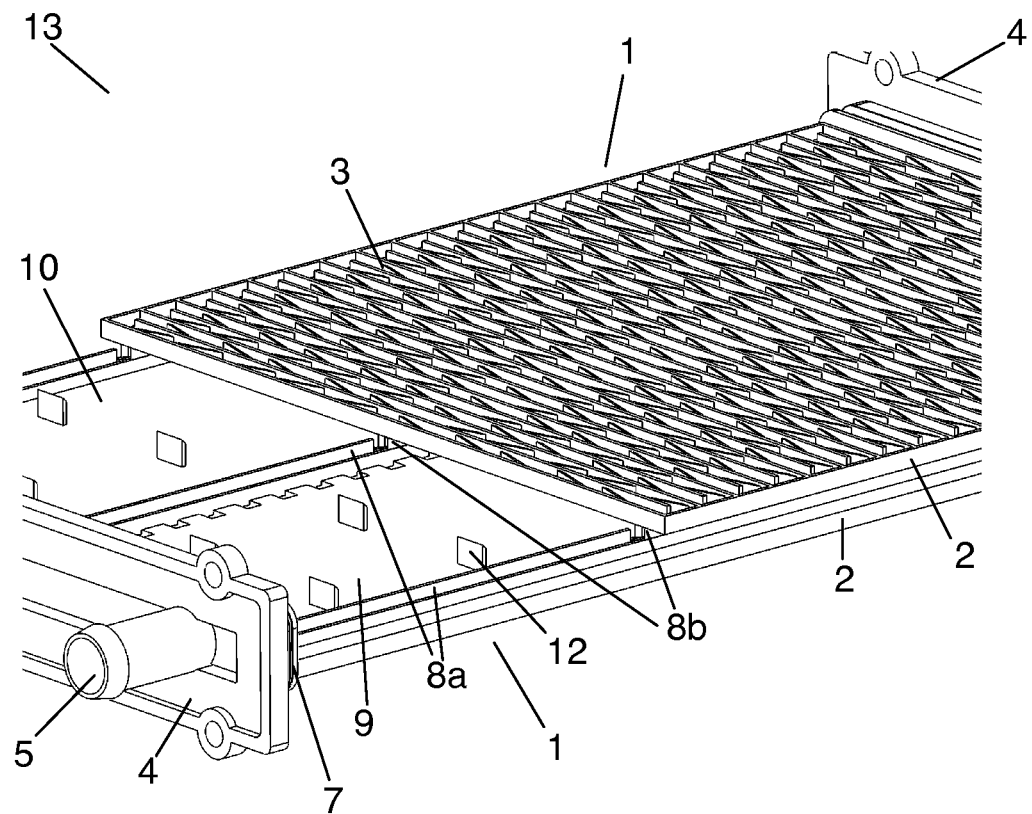
FIG. 3 is a perspective view of two flow distributors of the kind shown in FIGS. 1 and 2 during interconnection to form a flow distributor assembly.

FIG. 3 is a perspective view of a flow distributor assembly 13 comprising two flow distributors 1 of the kind shown in FIGS. 1 and 2. The flow distributors 1 are arranged with their manifold sides facing each other. The flow distributors 1 are joined in a sliding movement allowing the single wall sections 8a of the longitudinal walls 8 of one flow distributor 1 to be received in the grooves of the double wall sections 8b of the longitudinal walls 8 of the other flow distributor 1. In FIG. 3 the single wall sections 8a of the lower flow distributor 1 are arranged next to the double wall sections 8b of the upper flow distributor 1, and moving the flow distributors 1 further towards each other in a sliding movement will cause the single wall sections 8a to be received in the grooves of the double wall sections 8b, thereby forming the inlet manifold 9 and the outlet manifold 10 as described above.

Figure 4:
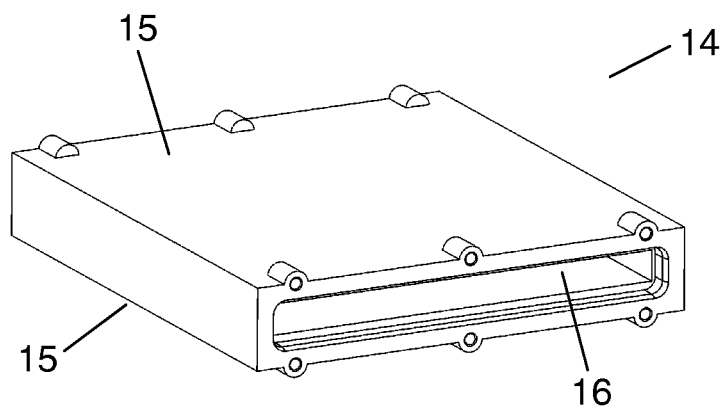
FIG. 4 is a perspective view of a housing for a cooling unit according to a first embodiment of the invention.

FIG. 4 is a perspective view of a housing 14 for a cooling unit according to a first embodiment of the invention. The housing 14 is in the form of a machined cold plate defining two surfaces 15 to be cooled. The housing 14 is initially formed by an extrusion process and later machined to obtain a correct flatness of the surfaces 15. Two openings 16, one of which is visible, are provided at opposite end parts of the housing 14. Flow distributors 1 of the kind shown in FIGS. 1-3 can be inserted into the interior of the housing 14 via the openings 16 and assembled as illustrated in FIG. 3. Thereby the flow cells 3 of the two flow distributors 1 are arranged adjacent to the surfaces 15 to be cooled.

Figure 5:
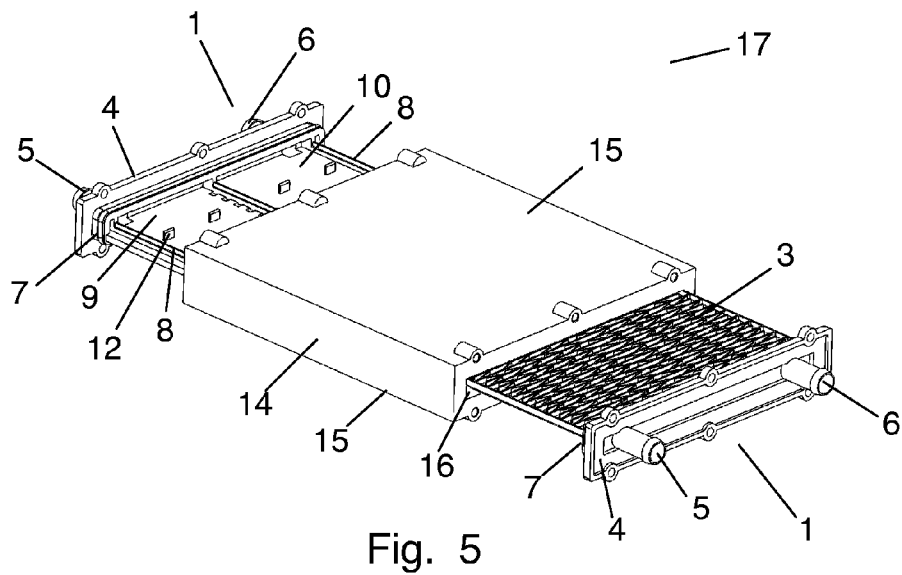
FIG. 5 is a perspective view of a cooling unit comprising the housing of FIG. 4 and the flow distributors of FIGS. 1-3 during assembly.

FIG. 5 is a perspective view of a cooling unit 17 according to a first embodiment of the invention. The cooling unit 17 comprises a housing 14 of the kind shown in FIG. 4 and two flow distributors 1 of the kind shown in FIGS. 1-3. The two flow distributors 1 are in the process of being inserted into the interior of the housing 14 via openings 16. Thus, the flow distributors 1 are being assembled as illustrated in FIG. 3. When the end caps 4 of the flow distributors 1 abut the housing 14, the O-ring 7 provides sealing between the end caps 4 and the housing 14.

Figure 6:
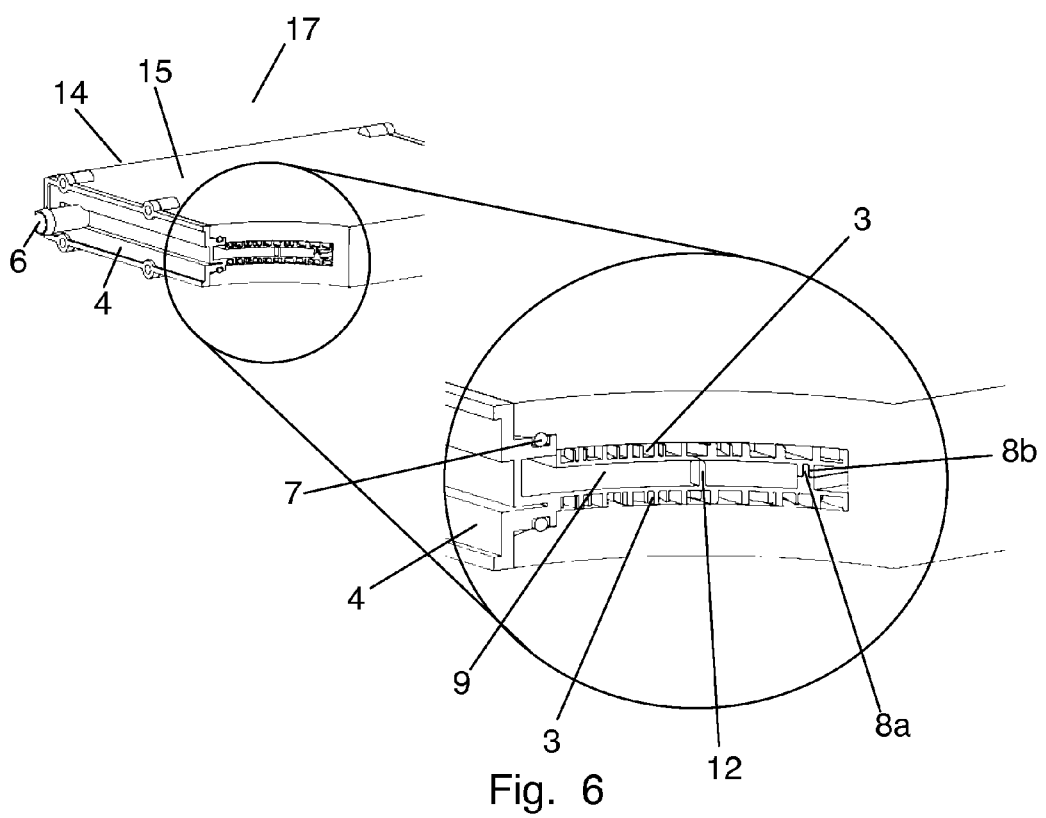
FIG. 6 shows the cooling unit of FIG. 5 with a part broken away.

FIG. 6 shows the cooling unit 17 of FIG. 5 in an assembled state. A part of the cooling unit 17 is broken away in order to reveal the interior part of the cooling unit 17. A section of the cooling unit 17 including the broken away part is enlarged to show details. It is clear from FIG. 6 that the flow distributors 1 have been assembled as described above, i.e. the single wall section 8a of one flow distributor 1 is received in the groove of the double wall section 8b of the other flow distributor 1. It can also be seen that the flow cells 3 are arranged adjacent to the surfaces 15 to be cooled, and that the fingers 12 are forcing the flow distributors 1 in a direction away from each other, thereby pushing the flow cells 3 into firm abutment with the surfaces 15 to be cooled. The 0-rings 7 provide sealing between the end caps 4 and the housing 14.

Figure 7:
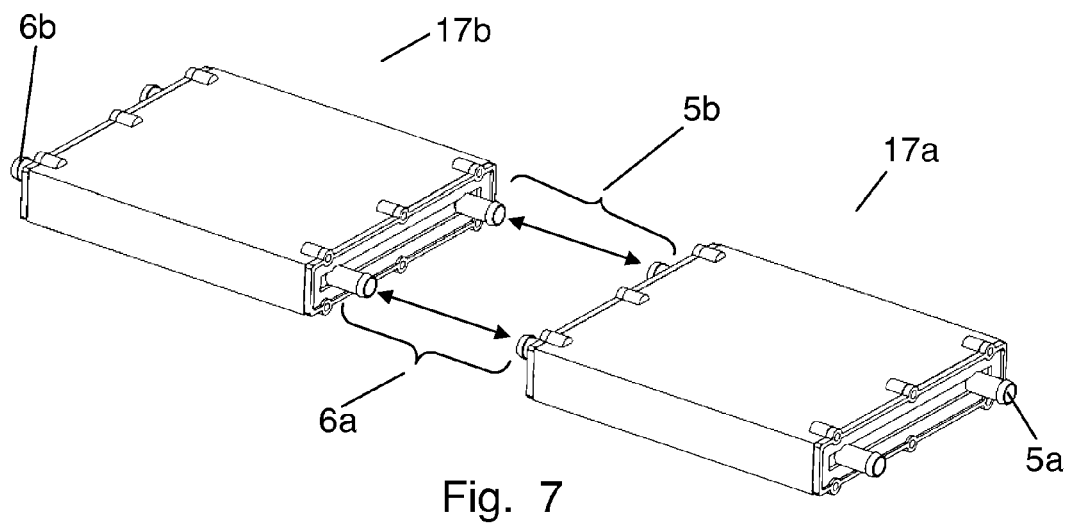
FIG. 7 shows two cooling units of the kind shown in FIGS. 5 and 6.

FIG. 7 is a perspective view of two cooling units 17 of the kind shown in FIGS. 5 and 6. FIG. 7 illustrates that such two cooling units 17 can be fluidly connected by connecting the fluid inlets 5 and the fluid outlets 6 of the cooling units 17 to each other. The inlet/outlet studs which are not connected to another inlet/outlet or to a fluid source or a fluid drain may be blocked. In the system shown in FIG. 7 fluid is supplied to the system via fluid inlet 5a, entering the inlet manifold of cooling unit 17a. Some of the fluid is guided further on to the inlet manifold of cooling unit 17b via fluid inlet 5b formed by the connected studs of the two cooling units 17a, 17b. From the inlet manifolds the fluid passes through the flow cells of both cooling units 17a, 17b, entering the respective outlet manifolds. Fluid is guided from the outlet manifold of cooling unit 17a to the outlet manifold of cooling unit 17b via fluid outlet 6a formed by the connected studs of the two cooling units 17a, 17b. Finally, the fluid exits the system via fluid outlet 6b. Thus, in the system shown in FIG. 7 the inlet manifolds of the two cooling units 17a, 17b are fluidly connected to form one large inlet manifold, and the outlet manifolds of the two cooling units 17a, 17b are fluidly connected to form one large outlet manifold.

Figure 8:
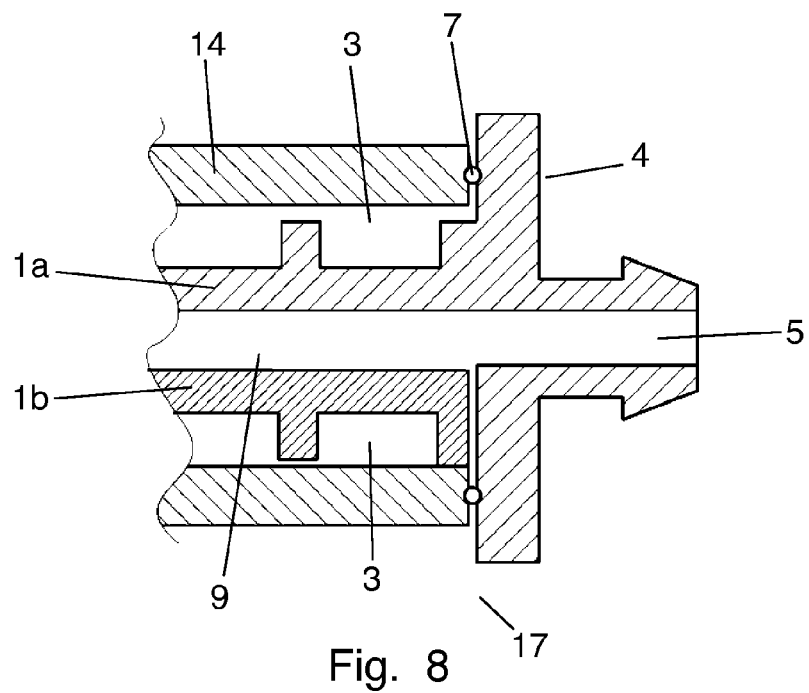
FIG. 8 is a cross sectional view of a part of the cooling unit of FIGS. 5 and 6.

FIG. 8 is a cross sectional view of a part of a cooling unit 17 of the kind shown in FIGS. 5 and 6. FIG. 8 illustrates the mutual positions of the flow distributors 1a, 1b inside the housing 14. It can also be seen that the O-ring 7 provides sealing between the end cap 4 and the housing 14. It is clear that the end cap 4 forms part of the flow distributor 1a.

Figure 9:
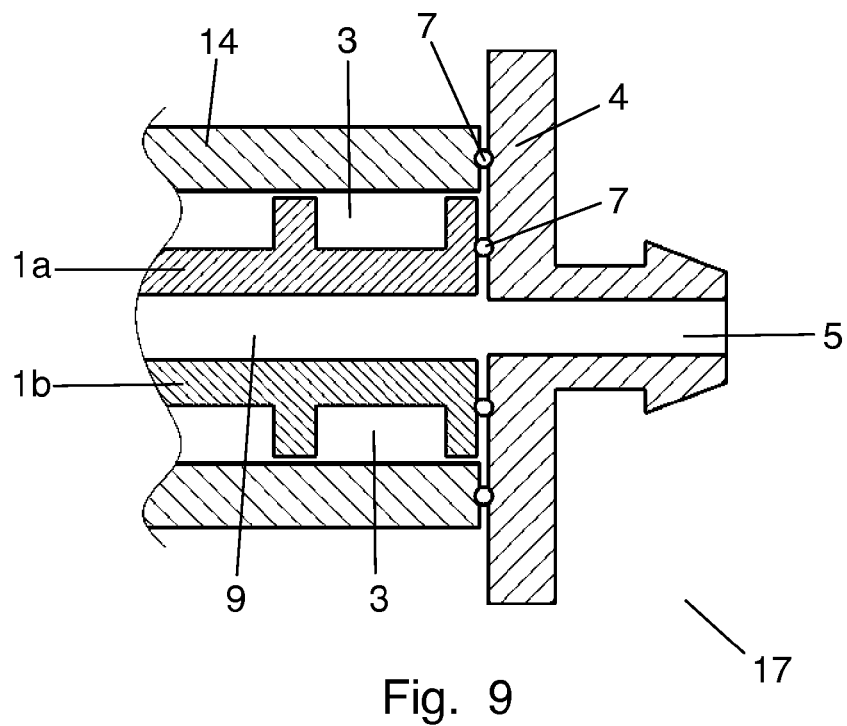
FIG. 9 is a cross sectional view of a part of a cooling unit according to a second embodiment of the invention.

FIG. 9 is a cross sectional view of a part of a cooling unit 17 according to a second embodiment of the invention. According to this embodiment, the end cap 4 is a separate member, i.e. it does not form part of one of the flow distributors 1. In order to provide sufficient sealing between the end cap 4 and the housing 14 and additional O-ring 7 has been added.

Figure 10:
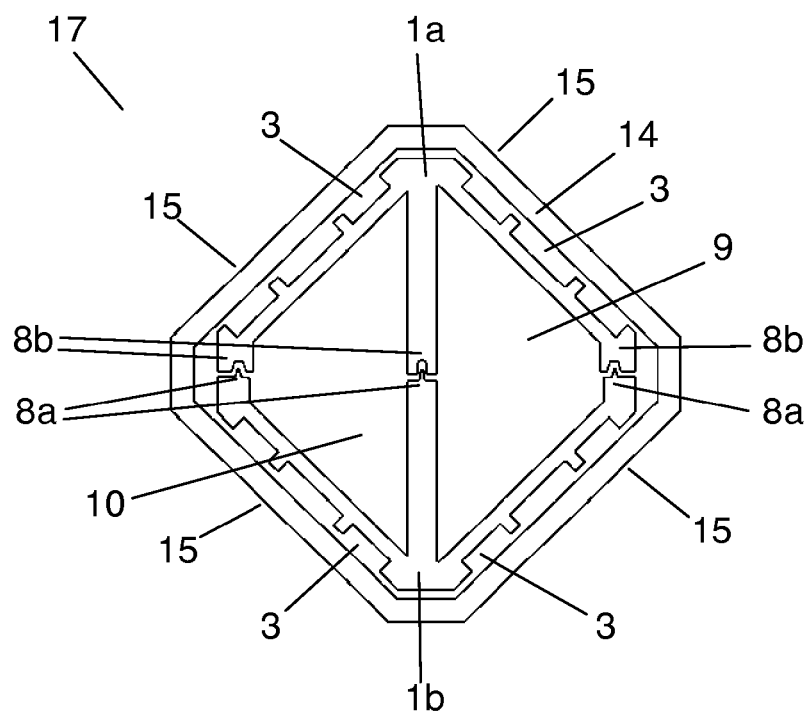
FIG. 10 is a cross sectional view of a cooling unit according to a third embodiment of the invention.

FIG. 10 is a cross sectional view of a part of a cooling unit 17 according to a third embodiment of the invention. According to this embodiment the housing 14 comprises four surfaces 15 to be cooled. Each of the flow distributors 1a, 1b is arranged to distribute a fluid flow across two surfaces 15 to be cooled by means of the flow cells 3.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A the cooling unit comprising:
a housing defining an inner cavity; and
a flow distributor assembly comprising:
a first flow distributor having a first set of flow cells formed therein, the first flow distributor comprising a first connecting region, a first wall portion of an inlet manifold and a first wall portion an outlet manifold, and
a second flow distributor having a second set of flow cells formed therein, the second flow distributor comprising a second connecting region, a second wall portion of the inlet manifold and a second wall portion of the outlet manifold,
wherein the first connecting region and the second connecting region are configured to interconnect in such a manner that the first flow distributor and the second flow distributor are joined to form the flow distributor assembly,
wherein the first connecting region and the second connecting region are configured to interconnect such that the first wall portion of the inlet manifold and the second wall portion of the inlet manifold together form an inlet manifold cavity that fluidly connects a fluid inlet to each of the flow cells of the first set of flow cells and the second set of flow cells,
wherein the first connecting region and the second connecting region are configured to interconnect such that the first wall portion of the outlet manifold and the second wall portion of the outlet manifold together form outlet manifold cavity that fluidly connects a fluid outlet to each of the flow cells of the first set of flow cells and the second set of flow cells, and
wherein the first flow distributor and the second flow distributor are inserted in the inner cavity of the housing through openings in the housing arranged substantially opposite to each other.

2. The flow distributor assembly according to claim 1, wherein the first flow distributor and/or the second flow distributor comprise(s) the fluid inlet and/or the fluid outlet.

3. The flow distributor assembly according to claim 1, wherein the first flow distributor and the second flow distributor are identical.

4. The flow distributor assembly according to claim 1, wherein the first connecting region and the second connecting region are adapted to slidingly engage to interconnect the connecting regions.

5. The flow distributor assembly according to claim 1, wherein at least two flow cells of the first set of flow cells and/or at least two flow cells of the second set of flow cells define parallel flow paths between the inlet manifold and the outlet manifold.

6. The flow distributor assembly according to claim 1, wherein at least one of the flow cells defines a flow path between the inlet manifold and the outlet manifold.

7. The flow distributor assembly according to claim 1, wherein the flow distributor assembly is adapted to be connected to at least one other substantially identical flow distributor assembly.

8. The flow distributor assembly according to claim 1, further comprising means for forcing the first flow distributor and the second flow distributor in a direction away from each other.

9. The cooling unit according to claim 1, wherein the first flow distributor and the second flow distributor each comprises an end cap adapted to abut an opening of the housing through which each of the first flow distributor and second flow distributor is inserted into the inner cavity of the housing.

10. The cooling unit according to claim 9, wherein the end caps of the flow distributors are provided with sealing means for providing sealing between the end caps and the housing.

11. The cooling unit according to claim 9, wherein each of the end caps is provided with a fluid inlet establishing a fluid connection between a fluid source and the inlet manifold, and a fluid outlet, establishing a fluid connection between the outlet manifold and a fluid drain.

12. The cooling unit according to claim 1, wherein the housing defines at least two surfaces to be cooled, and wherein the flow cells of the first set of flow cells are arranged to distribute a flow of fluid across at least a first surface to be cooled and the flow cells of the second set of flow cells are arranged to distribute a flow of fluid across at least a second surface to be cooled.

13. The cooling unit according to claim 12, wherein the first surface to be cooled and the second surface to be cooled are arranged substantially opposite to each other.

14. The cooling unit according to claim 1, wherein the housing is an extruded cold plate.

\* \* \* \* \*